(12) United States Patent
Chopin et al.

(10) Patent No.: US 11,787,097 B2
(45) Date of Patent: Oct. 17, 2023

(54) CONDUIT INSERTS FOR ENCAPSULANT COMPOUND FORMULATION KNEADING AND ENCAPSULATION BACK-END ASSEMBLY PROCESSES

(71) Applicant: NXP USA, Inc., Austin, TX (US)

(72) Inventors: Sheila F. Chopin, Austin, TX (US); Nishant Lakhera, Austin, TX (US); Boon Yew Low, Subang Jaya (MY)

(73) Assignee: NXP USA, INC., Austin, TX (US)

( * ) Notice: Subject to any disclaimer, the term of this patent is extended or adjusted under 35 U.S.C. 154(b) by 239 days.

(21) Appl. No.: 17/173,130

(22) Filed: Feb. 10, 2021

(65) Prior Publication Data

US 2022/0250301 A1    Aug. 11, 2022

(51) Int. Cl.
*B29C 48/27* (2019.01)
*B29C 48/39* (2019.01)
*B29C 48/375* (2019.01)
*H01L 21/56* (2006.01)

(52) U.S. Cl.
CPC .......... *B29C 48/271* (2019.02); *B29C 48/388* (2019.02); *B29C 48/39* (2019.02); *H01L 21/565* (2013.01)

(58) Field of Classification Search
None
See application file for complete search history.

(56) References Cited

U.S. PATENT DOCUMENTS

| | | | |
|---|---|---|---|
| 4,352,119 A | 9/1982 | Bardens et al. | |
| 6,474,355 B1 | 11/2002 | Jirawat et al. | |
| 10,988,723 B1 * | 4/2021 | Hatch | C12M 23/46 |
| 2007/0231956 A1 * | 10/2007 | Fukaya | B29C 45/1753 |
| | | | 438/106 |
| 2007/0254403 A1 | 11/2007 | Fisher et al. | |
| 2018/0250864 A1 * | 9/2018 | Clark | B29C 48/05 |
| 2018/0280674 A1 * | 10/2018 | Shapiro | A61M 37/00 |

FOREIGN PATENT DOCUMENTS

EP    0025647 A2    3/1981

* cited by examiner

*Primary Examiner* — Jay C Chang (57) ABSTRACT

An encapsulant compound apparatus, includes a mechanical operator, and an insert disposed on a surface of the mechanical operator. The insert operates to capture foreign material in the encapsulant compound.

6 Claims, 6 Drawing Sheets

CONDUIT INSERTS FOR ENCAPSULANT COMPOUND FORMULATION KNEADING AND ENCAPSULATION BACK-END ASSEMBLY PROCESSES

FIELD OF THE DISCLOSURE

This disclosure generally relates to encapsulant compounds, and more particularly relates to providing metal coiled and rigid conduit inserts for encapsulant compound formulation kneading and encapsulation back-end assembly processes.

BACKGROUND

Encapsulation in electronic device manufacturing is the process of covering the components of an electronic device or assembly with an encapsulant compound to protect the components from mechanical shock and vibration, corrosion, and contamination form dust, moisture, chemicals, or other contaminants. Encapsulation can also be performed to provide for a tamper resistant and tamper evident electronic device or assembly. Encapsulation can be performed on an open electronic device or assembly using a dam and fill operation where a barrier dam is placed around the components to be encapsulated and pouring the encapsulant compound onto the components within the barrier dam, or by use of an injection molding process that injects the encapsulant compound into a mold cavity that surrounds the components to be encapsulated. Encapsulation can also be performed on a closed electronic device or assembly by injecting the encapsulant compound into a cap or cover for the electronic device or assembly and then assembling the cap or cover onto the electronic device or assembly. In generally, encapsulation provides greater protection to an electronic device or assembly than can be achieved with a conformal coating process. Encapsulant compounds are typically provided from compound manufacturers in a pelletized form, and electronics manufacturers then melt the encapsulant compound pellets for use in the encapsulation process. Foreign material and contamination in the encapsulant compounds are a persistent problem for electronics manufacturers. It will therefore be understood that better processes for the removal of such foreign material and contaminants from encapsulant compounds is desirable for the improved reliability of encapsulated electronic devices and assemblies.

SUMMARY

In a first embodiment, an encapsulant compound apparatus may include a mechanical operator; and a first insert disposed on a surface of the mechanical operator. The first insert may operate to capture foreign material in the encapsulant compound.

In a particular case, the first insert may be a coil magnet placed within a hole in the surface of the mechanical operator. In another case, the first insert may be a rigid magnet pressed into a hole in the surface of the mechanical operator. In yet another case, the insert first may be fabricated of one of zinc, stainless steel, a titanium alloy, and a composite plastic. In still another case, the first insert may be replaceable. In a further case, the mechanical operator may further include a second insert disposed on the surface of the mechanical operator.

In another particular case, the mechanical operator may be characterized as a kneader including a rotator shaft and a kneader cam installed onto the rotator shaft. The kneader cam may include the first insert disposed on a kneading surface of the kneading cam, wherein, when the rotator shaft is rotated, the kneader cam may operate to knead the encapsulant compound and the insert may operate to capture foreign material in the encapsulant compound.

In another particular case, the mechanical operator may be characterized as a pellet vibrator for cleaning encapsulant compound pellets. The pellet vibrator may include a pellet buffer bowl including the first insert disposed on a surface of the pellet buffer bowl, wherein, when the pellet buffer bowl is vibrated, the first insert may operate to capture foreign material mixed with the encapsulant compound pellets.

In another particular case, the mechanical operator may be characterized as an encapsulant extruder for extruding the encapsulant compound onto an electronic device. The encapsulant extruder may include a reservoir for melting encapsulant compound pellets, a plunger for extruding the melted encapsulant compound onto the electronic device, and a mold runner for channeling the melted encapsulant compound from the reservoir to the electronic device. The first insert may be characterized as a disk placed upon the plunger to capture the foreign material mixed with the melted encapsulant compound.

In another particular case, the mechanical operator may be characterized as an encapsulant extruder for extruding encapsulant compound onto an electronic device. The encapsulant extruder may include a reservoir for melting encapsulant compound pellets, a plunger for extruding the melted encapsulant compound onto the electronic device, ands a mold runner for channeling the melted encapsulant compound from the reservoir to the electronic device. The first insert may be characterized as a filter placed atop the encapsulant compound pellets. The melted encapsulant compound may be filtered through the filter before being extruded through the mold runner to capture foreign material mixed with the melted encapsulant compound.

In another embodiment, a method may include processing encapsulant compound with a mechanical operator, and disposing a first insert on a surface of the mechanical operator. The first insert may operate to capture foreign material in the encapsulant compound.

In a particular case, the first insert may be a coil magnet placed within a hole in the surface of the mechanical operator. In another case, the first insert may be a rigid magnet pressed into a hole in the surface of the mechanical operator. In yet another case, the insert first may be fabricated of one of zinc, stainless steel, a titanium alloy, and a composite plastic. In still another case, the first insert may be replaceable. In a further case, the mechanical operator may further include a second insert disposed on the surface of the mechanical operator.

In another particular case, the mechanical operator may be characterized as a kneader including a rotator shaft and a kneader cam installed onto the rotator shaft. The method may further include installing a kneader cam on a rotator shaft, the kneader cam including the first insert disposed on a kneading surface of the kneading cam, and rotating the rotator shaft to operate the kneader cam to knead the encapsulant compound. When the rotator shaft is rotated, the first insert may operate to capture foreign material in the encapsulant compound.

In another particular case, the mechanical operator may be characterized as a pellet vibrator for cleaning encapsulant compound pellets. The method may further include processing the encapsulant compound pellets in a pellet buffer bowl of the pellet vibrator, the pellet buffer bowl including the first insert disposed on a surface of the pellet buffer bowl, and vibrating the pellet buffer bowl. When the pellet buffer bowl is vibrated, the first insert may operate to capture foreign material mixed with the encapsulant compound pellets.

In another particular case, the mechanical operator may be characterized as an encapsulant extruder for extruding the encapsulant compound onto an electronic device. The method may further include placing the first insert into a reservoir of the encapsulant extruder, placing encapsulant compound pellets into the reservoir of the encapsulant extruder atop the first insert, melting the encapsulant compound pellets, and extruding the melted encapsulant compound onto the electronic device.

In another particular case, the mechanical operator may be characterized as an encapsulant extruder for extruding the encapsulant compound onto an electronic device. The method may further include placing encapsulant compound pellets into a reservoir of the encapsulant extruder, placing the first insert atop the encapsulant compound pellets, melting the encapsulant compound pellets, and extruding the melted encapsulant compound onto the electronic device.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, as needed or desired.

Figure 1:
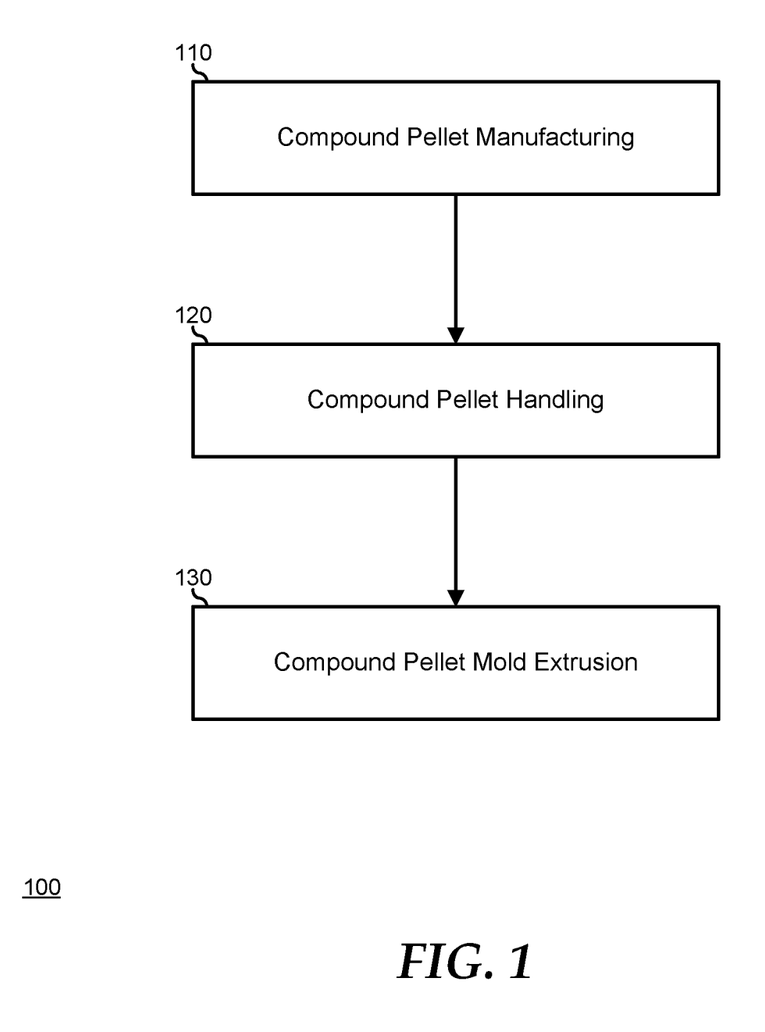
FIG. 1 illustrates a high-level process flow for the manufacture and use of pelletized encapsulant compounds according to an embodiment of the current disclosure.

FIG. 1. illustrates a high-level process flow 100 for the manufacture and use of pelletized encapsulant compounds. In a first step 110, encapsulant compound pellets (hereinafter referred to as "pellets") are manufactured by a compound manufacturer. In a second step 120, the pellets are handled prior to use in the assembly of electronic devices and assemblies. The handling of the pellets, as described herein, may be understood to be at the site of manufacture of the pellets after step 110, or to be at the site of the use of the pellets in encapsulating the electronic devices or assemblies before step 130. In a third step 130, the pellets are melted and extruded into a mold to encapsulate the electronic devices or assemblies. Encapsulant compounds may include epoxy mold compounds (EMCs), silicon compounds, urethane compounds, acrylic compounds, or other compounds. The details of encapsulant compounds and encapsulant compound pellets, of pellet handling, and of pellet molding, are known in the art, and will not be further described herein, except as needed to illustrate the current embodiments.

Figure 2:
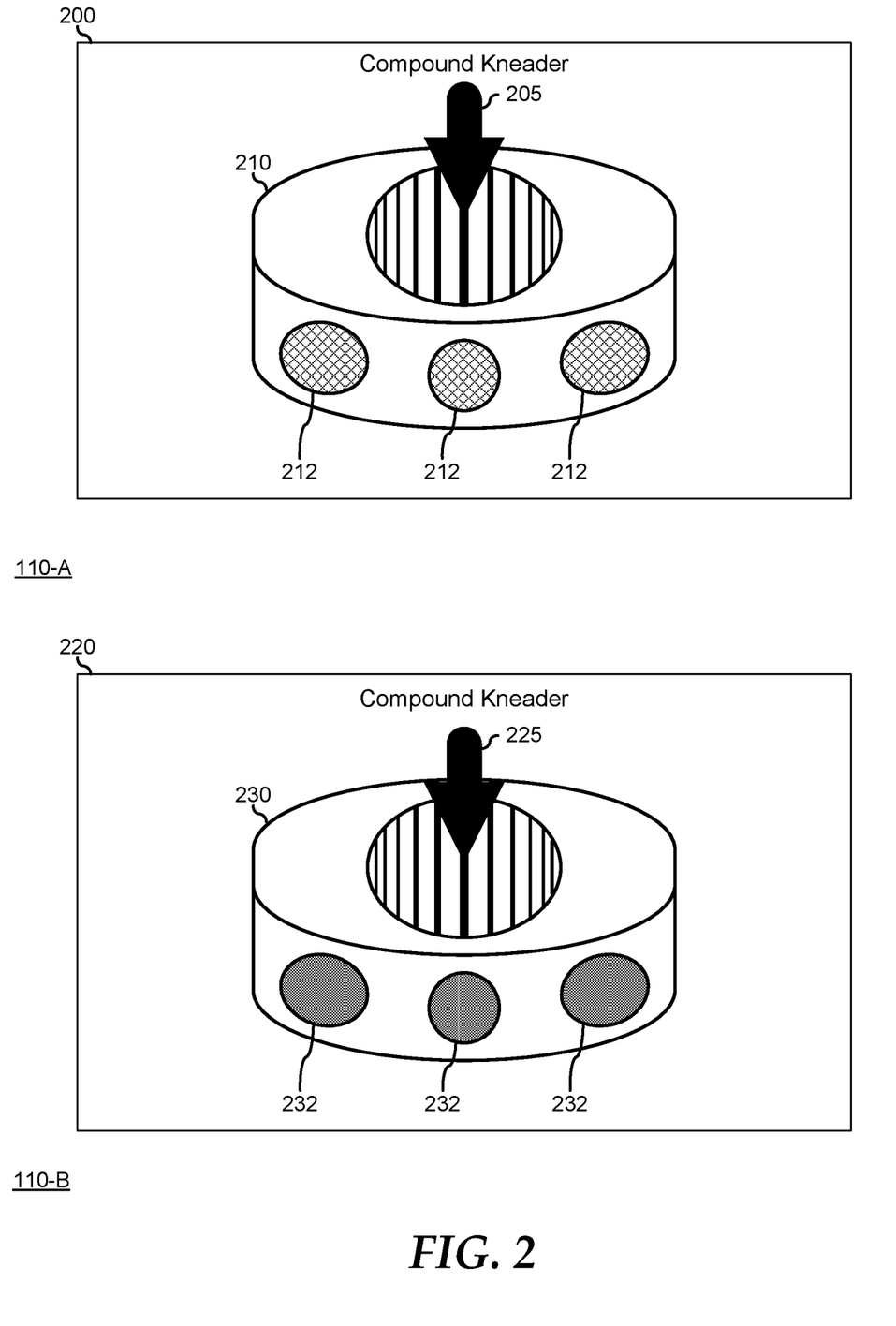
FIG. 2 is a block diagram of a pellet manufacturing process according to an embodiment of the current disclosure.

FIG. 2 illustrates the pellet manufacturing process 110 from FIG. 1. Here, a typical manufacturing process of pellets includes a compound kneading operation performed in a kneader. The kneader includes a series of parallel rotating shafts (not illustrated), upon which are affixed a number of kneaders. The kneaders are oblong shaped and are affixed to the rotating shafts to provide a mixing and kneading action for the compound. A typical shaft may include one or more kneader, and each adjacent shaft may rotate in an opposite direction, such that the kneaders on the adjacent shafts provide an alternating compression and expansion of the compound, thereby mixing and kneading the compound. The kneaders are fabricated with magnetic inserts in the face of the kneaders that entrap magnetic particles contained in the compound.

In a first embodiment, pellet manufacturing process 110-A includes a compound kneader 200 with one or more kneader cam 210 disposed on a shaft 205. Kneader cam 210 includes one or more magnetic insert 212 installed on the kneading surface of the kneader cam. Magnetic inserts 212 are magnetic coil inserts that are placed within matching holes in the surface of kneader cam 210. In a second embodiment, pellet manufacturing process 110-B includes a compound kneader 220 with one or more kneader cam 230 disposed on a shaft 225. Kneader cam 230 includes one or more magnetic insert 232 installed on the kneading surface of the kneader cam. Magnetic inserts 232 are rigid magnets that are pressed into the matching holes in the surface of kneader cam 230. In either embodiment, as the kneader cams rotate within the compound, magnetic foreign material is attracted to and retained by the magnetic inserts. After a batch of compound is kneaded, the compound kneader is cleaned. Here, the cleaning includes removing the trapped magnetic foreign material from the magnetic inserts. The use of kneader cams with magnetized inserts provides for the fabrication of compound pellets that do not include magnetic foreign material.

The magnetic inserts may be fabricated of a corrosion resistant magnetic material, such as zinc, stainless steel, a titanium alloy, a composite plastic, or another magnetic material, as needed or desired. It will be understood that, with use, the strength of the magnetic inserts will diminish such that, over time, the amount of magnetic foreign material that is retained by the magnetic inserts may decrease. In a particular embodiment, the magnetic inserts are replaceable. In another embodiment, the magnetic inserts are not replaceable, but the kneader cams are replaceable. In this way, a compound kneader as is known in the art can be modified to improve the quality of the compound pellets produced by replacing kneader cams that do not include magnetic inserts with new kneader cams with magnetic inserts, without having to replace the entire compound kneader.

In another embodiment, not illustrated, a compound kneader may include one or more counter-rotating screws that operate to mix and knead the encapsulant compound, and to also maintain a flow of the compound through the compound kneader for a continuous flow process. Here, the counter-rotating screws will be understood to include one or more magnetic insert within the screw face of the screws to entrap magnetic foreign material. Subsequent to the kneading as performed by the compound kneaders in the above-described embodiments, the pellet manufacturing process will include forming the compound batch into pellets. Further details of compound kneading and compound pelletization are known in the art, and will not be further described herein, except as needed to illustrate the current embodiments.

Figure 3:
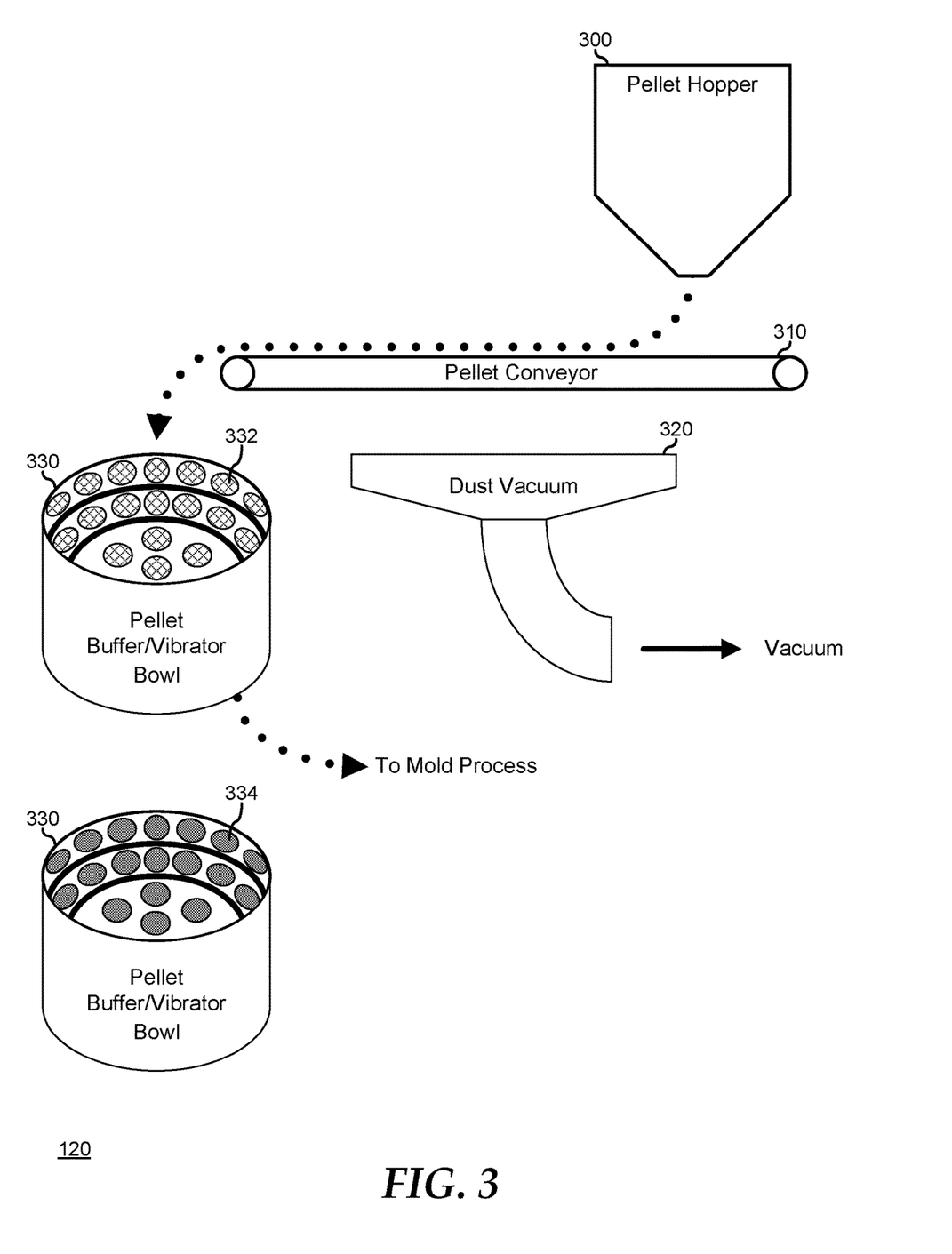
FIG. 3 is a diagram of a pellet handling process according to an embodiment of the current disclosure.

FIG. 3 illustrates the pellet handling process 120 from FIG. 1. Here, a typical pellet handling process includes a pellet hopper 300, a pellet conveyor 310, a dust vacuum 320, and a pellet buffer/vibrator bowl 330. Pellets are stored in pellet hopper 300 until needed and are then released onto pellet conveyor 310. Pellet conveyor 210 transfers the pellets to pellet buffer/vibrator bowl 330. Pellet conveyor 310 is configured to permit an air flow created by dust vacuum 320 that draws dust and fine fibers from out of the stream of pellets, thereby reducing the amount of foreign material that enters pellet buffer/vibrator bowl 330. However, it will be further understood that, in some cases, pellet conveyor 310 may be understood to still transfer foreign material to pellet buffer/vibrator bowl 330, depending on the cleanliness of the environment. Pellet buffer/vibrator bowl 330 operates to further shake foreign material from the accumulated pellets.

In a particular embodiment, pellet buffer/vibrator bowl 330 includes one or more magnetic insert 332 installed in the side and bottom of the pellet buffer/vibrator bowl. Here, magnetic inserts 332 are magnetic coil inserts that are placed within matching holes in the side and bottom surfaces of pellet buffer/vibrator bowl 330. In a second embodiment, pellet buffer/vibrator bowl 330 includes one or more magnetic insert 334 installed in the side and bottom of the pellet buffer/vibrator bowl. Here, magnetic inserts 334 are rigid magnets that are pressed into matching holes in the side and bottom of pellet buffer/vibrator bowl 330. As the stream of pellets from pellet conveyor 310 enter pellet buffer/vibrator bowl 330, magnetic foreign material is attracted to and retained by the magnetic inserts. After a batch of pellets are handled by handling process 120, pellet buffer/vibrator bowl is cleaned. Here, the cleaning includes removing the trapped magnetic foreign material from the magnetic inserts. The use of pellet buffer/vibrator bowls with magnetized inserts provides for the further reduction in the amount of magnetic foreign material from the pellets used in pellet mold extrusion. Subsequent to the pellet handling process, the pellets are transferred to pellet mold extrusion process 130, as described below. Further details of pellet handling processes are known in the art and will not be further described herein except as needed to illustrate the current embodiments.

Figure 4:
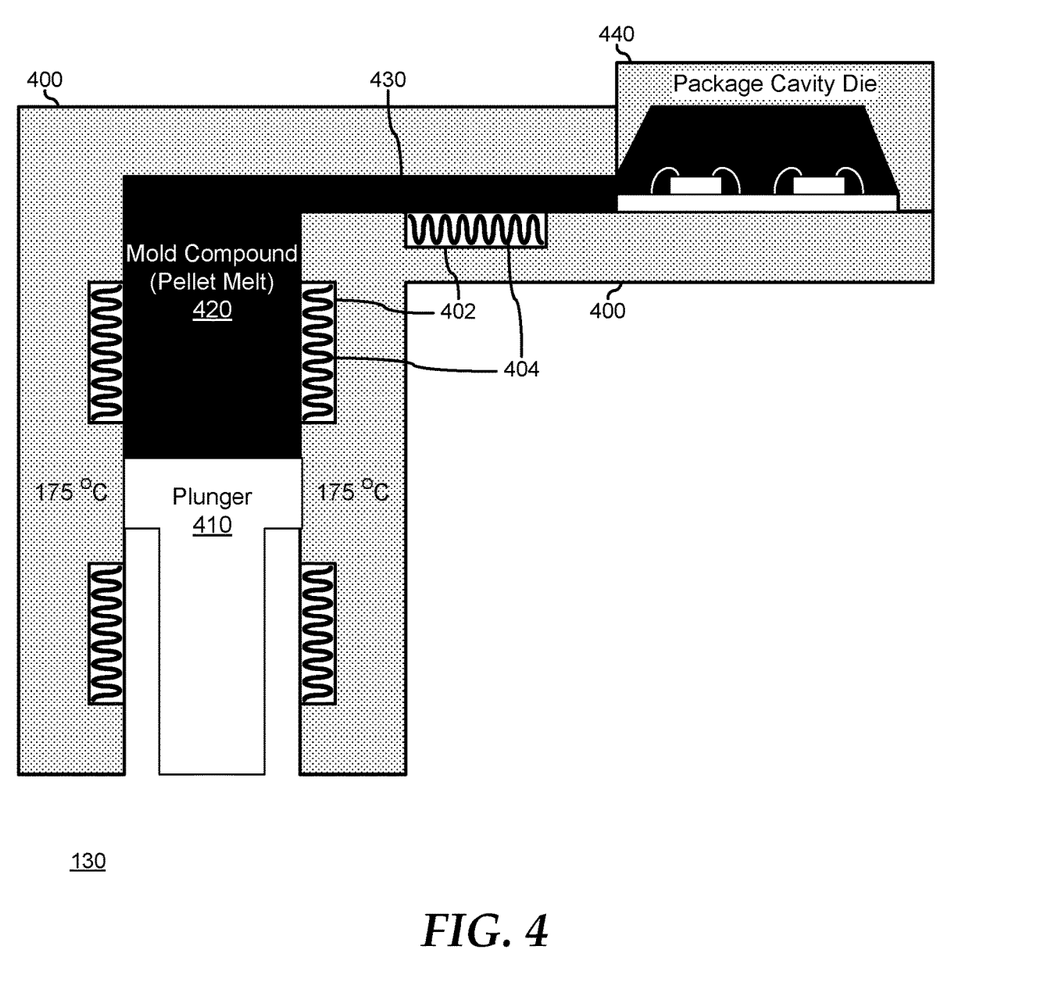
FIGS. 4-6 are diagrams of encapsulant extruders according to various embodiments of the current disclosure.
Figure 5:
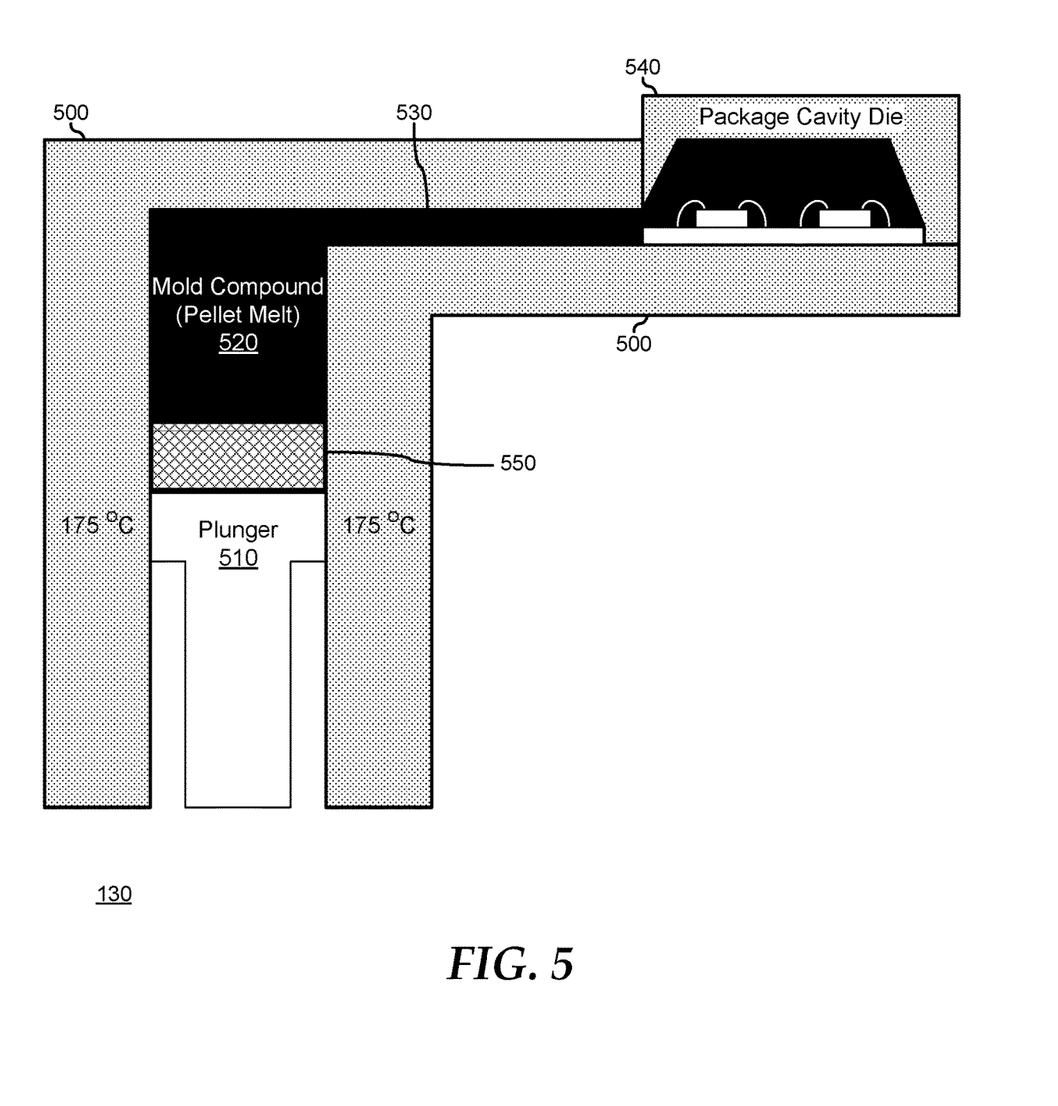
Figure 6:
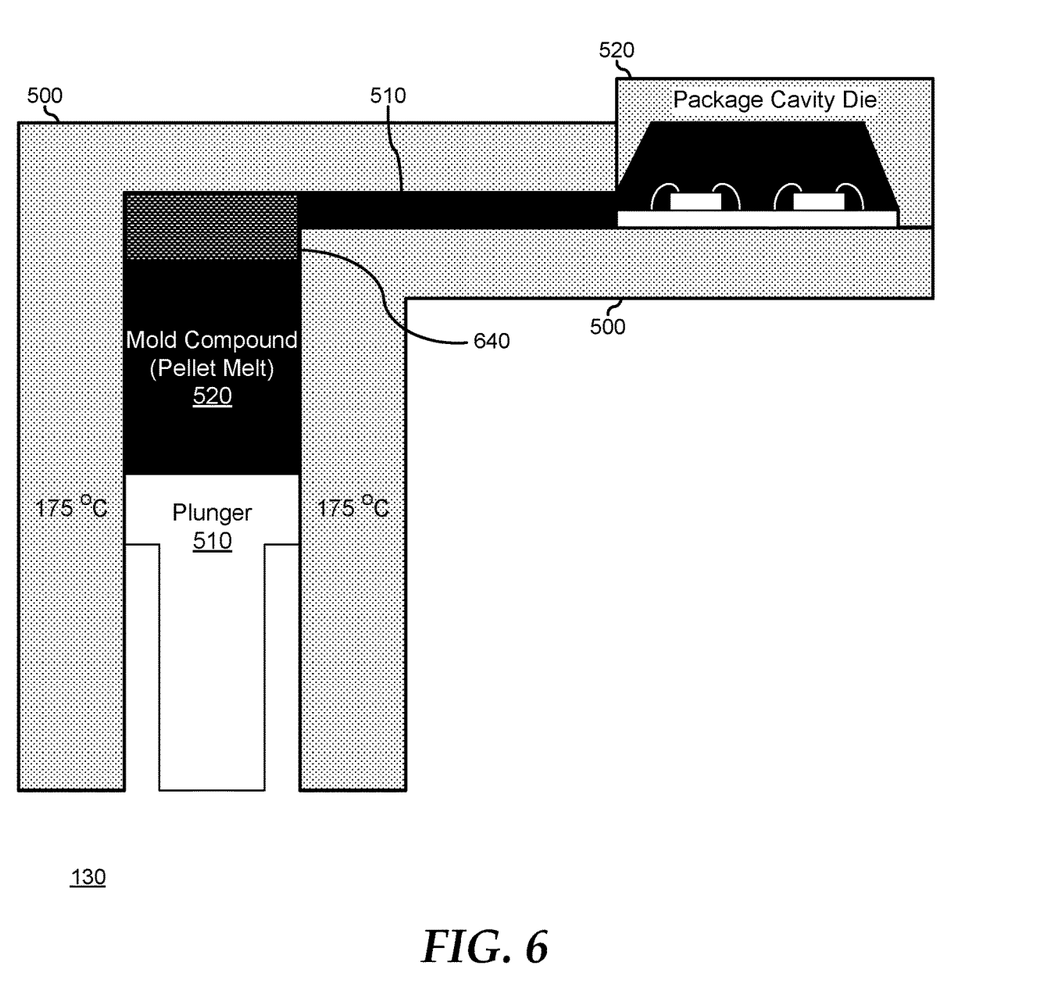

FIGS. 4-6 illustrate various embodiments of pellet mold extrusion process 130. In FIG. 4, an extruder 400 includes a pellet reservoir, sometimes referred to as a plunger wall, with a plunger 410 within the reservoir. Plunger 410 is drawn to the bottom of the reservoir, and pellets are placed into the reservoir. Extruder 400 is energized to heat the pellets to a viscous liquid pellet melt 420. For example, extruder 400 can heat the pellets to 175° C., or another temperature, as needed or desired to melt the pellets to the desired consistency. When the pellets are melted, plunger 420 is forced into the reservoir, extruding pellet melt 420 through compound runner 430 and into package cavity die 440 to encapsulate the electronic device or assembly within the package cavity die. The pellet melt is permitted to cool, and the encapsulated electronic device or assembly is removed from pellet mold extrusion process 130 for further processing as needed or desired.

Extruder 400 includes one or more magnetic insert 404 installed within cavities 402 within the sides of the reservoir or compound runner 430. Magnetic inserts 404 may represent coil magnets that are placed within cavities 402 of extruder 400, or may represent rigid magnets that are pressed into the cavities of the extruder. As pellet melt 420 is extruded from the reservoir and through compound runner 430, magnetic foreign material is attracted to and retained by the magnetic inserts. After a batch of pellet melt 420 is extruded to encapsulate the electronic devices or assemblies, extruder 400 is cleaned. Here, the cleaning includes removing the trapped magnetic foreign material from the magnetic inserts. The use of magnetic inserts 402 in the reservoir and compound runner 430 provides for the further reduction in the amount of magnetic foreign material in the final encapsulated electronic device or assembly.

FIG. 5 illustrates another embodiment of pellet mold extrusion process 130 similar to the embodiment described in FIG. 4. Here, an extruder 500 includes a reservoir with a plunger 510 within the reservoir. Plunger 510 is drawn to the bottom of the reservoir, and a magnetic disk 550 is placed atop the plunger before pellets are placed into the reservoir. Extruder 500 is energized to heat the pellets to a viscous liquid pellet melt 520. For example, extruder 500 can heat the pellets to 175° C., or another temperature, as needed or desired to melt the pellets to the desired consistency. When the pellets are melted, plunger 520 is forced into the reservoir, extruding pellet melt 520 through compound runner 530 and into package cavity die 540 to encapsulate the electronic device or assembly within the package cavity die. The pellet melt is permitted to cool, and the encapsulated electronic device or assembly is removed from pellet mold extrusion process 130 for further processing as needed or desired. Here, the inclusion of magnetic disk 550 causes magnetic foreign material to be attracted to the bottom of pellet melt 520, rather than to be extruded into the encapsulated electronic device or assembly. After a batch of pellet melt 520 is extruded to encapsulate the electronic devices or assemblies, extruder 500 is cleaned. Here, the cleaning includes removing the trapped magnetic foreign material from magnetic disk 550. The use of magnetic disk 550 in the bottom of the reservoir provides for the further reduction in the amount of magnetic foreign material in the final encapsulated electronic device or assembly.

FIG. 6 illustrates another embodiment of pellet mold extrusion process 130 as described with respect to FIG. 5. Here, rather than placing magnetic disk 550 into the reservoir prior to the addition of the pellets, the pellets are first placed into the reservoir, and a magnetic filter 640 is placed atop the pellets. Then, when the pellets are melted and pellet melt 520 is forced through magnetic filter 640, through compound runner 530 and into package cavity die 540 to encapsulate the electronic device or assembly. In this way, not only is magnetic foreign material captured in magnetic filter 640, but other foreign material is captured as well. An example of a magnetic filter may include a magnetized sintered filter, a cloth or paper filter material incorporated with a magnetic mesh, or another type of magnetic filter, as needed or desired. Note that, with either the embodiment of FIG. 5, or the embodiment of FIG. 6, existing mold extrusion process equipment may be utilized without modification, and only the magnetic disk 550 or the magnetic filter 640 need be added to the process to improve the retention of magnetic foreign material, and improve the reliability of the electronic devices or assemblies.

In a particular embodiment, one or more of magnetic inserts, a magnetic disk, or a magnetic filter may be surface treated to ensure that silica particles in the mold compound do not get trapped. For example, the magnetic inserts, the magnetic disk, or the magnetic filter may be treated to create an opposite charge to the silica filler in the mold compound, thereby causing the silica filter to be repelled from the magnetic inserts, the magnetic disk, or the magnetic filter, as needed or desired. In another particular embodiment, where a magnetic insert, a magnetic disk, or a magnetic filter are fabricated of zinc or otherwise fabricated of a material that includes zinc, chlorine ions within the encapsulant compound will be attracted to the zinc, thereby removing a corrosive agent from the encapsulant compound. In another particular embodiment, particularly where a magnetic insert is a coil magnet, further operates to trap foreign material within the coils.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An encapsulant compound apparatus, comprising:
    a mechanical operator characterized as a kneader, the kneader comprising:
        a rotator shaft; and
        a kneader cam installed onto the rotator shaft, the kneader cam including a first insert disposed on a kneading surface of the kneading cam, wherein, when the rotator shaft is rotated, the kneader cam operates to knead an encapsulant compound and the first insert operates to capture foreign material in the encapsulant compound.

2. The encapsulant compound apparatus of claim 1, wherein the first insert is a coil magnet placed within a hole in the surface of the mechanical operator.

3. The encapsulant compound apparatus of claim 1, wherein the first insert is a rigid magnet pressed into a hole in the surface of the mechanical operator.

4. The encapsulant compound apparatus of claim 1, wherein the insert first is fabricated of one of zinc, stainless steel, a titanium alloy, and a composite plastic.

5. The encapsulant compound apparatus of claim 1, wherein the first insert is replaceable.

6. The encapsulant compound apparatus of claim 1, wherein the mechanical operator further includes a second insert disposed on the surface of the mechanical operator.

* * * * *